US008260245B2

(12) United States Patent
Arnborg

(10) Patent No.: US 8,260,245 B2
(45) Date of Patent: *Sep. 4, 2012

(54) MONOLITHICALLY INTEGRATED CIRCUIT

(75) Inventor: Torkel Arnborg, Stockholm (SE)

(73) Assignee: Infineon Technologies AG, Neubiberg (DE)

( * ) Notice: Subject to any disclaimer, the term of this patent is extended or adjusted under 35 U.S.C. 154(b) by 532 days.

This patent is subject to a terminal disclaimer.

(21) Appl. No.: 12/432,778

(22) Filed: Apr. 30, 2009

(65) Prior Publication Data

US 2010/0109092 A1     May 6, 2010

Related U.S. Application Data

(63) Continuation of application No. 11/482,860, filed on Jul. 7, 2006, now Pat. No. 7,536,166.

(30) Foreign Application Priority Data

Jan. 9, 2004   (SE) ...................................... 0400035

(51) Int. Cl.
*H04B 1/28*        (2006.01)
*H04B 7/00*        (2006.01)
(52) U.S. Cl. ...................... 455/333; 455/252.1; 455/323
(58) Field of Classification Search .................. 455/333, 455/252.1, 323, 234.1; 257/277, 531, 350
See application file for complete search history.

(56) References Cited

U.S. PATENT DOCUMENTS

| 5,446,309 | A | * | 8/1995 | Adachi et al. | 257/528 |
| 5,789,799 | A | * | 8/1998 | Voinigescu et al. | 257/578 |
| 5,815,014 | A | * | 9/1998 | Zhang et al. | 327/122 |
| 6,228,677 | B1 | | 5/2001 | Kinsman et al. | |
| 6,342,424 | B1 | | 1/2002 | Pichler | |
| 6,355,970 | B1 | | 3/2002 | Fujii | |
| 6,455,915 | B1 | | 9/2002 | Wong | |
| 6,707,116 | B2 | | 3/2004 | Ohkubo et al. | |
| 6,867,475 | B2 | | 3/2005 | Yoshimura | |
| 6,881,639 | B2 | * | 4/2005 | Mochizuki et al. | 438/312 |
| 6,933,205 | B2 | * | 8/2005 | Matsuo et al. | 438/406 |
| 7,227,222 | B2 | * | 6/2007 | Kanematsu | 257/328 |
| 7,525,407 | B2 | * | 4/2009 | Lee et al. | 336/200 |

FOREIGN PATENT DOCUMENTS

EP    0966040 A1    6/1998
EP    1160841 A2    5/2001

* cited by examiner

*Primary Examiner* — Sonny Trinh
(74) *Attorney, Agent, or Firm* — SprylP, LLC

(57) ABSTRACT

A monolithically integrated circuit, particularly an integrated circuit for radio frequency power applications, may include a transistor and a spiral inductor. The spiral inductor is arranged above the transistor. An electromagnetic coupling is created between the transistor and the inductor. The transistor may have a finger type layout to prevent any significant eddy currents caused by the electromagnetic coupling from occurring. The chip area needed for the circuit may be reduced by such arrangement.

20 Claims, 3 Drawing Sheets

MONOLITHICALLY INTEGRATED CIRCUIT

RELATED APPLICATIONS

This application is a continuation application of U.S. patent application Ser. No. 11/482,860 filed on Jul. 7, 2006. The patent application Ser. No. 11/482,860 claims priority benefit of International Application No. PCT/SE2004/001973 filed on Dec. 22, 2004 and which claims priority benefit of Sweden Application No. SE0400035-2 filed on Jan. 9, 2004. Priority benefit of the indicated applications is hereby claimed and the entirety of the applications are hereby incorporated herein by reference.

TECHNICAL FIELD

The implementations herein generally relate to the field of integrated circuit technology, and more specifically the implementations to a monolithically integrated circuit comprising a transistor and a spiral inductor.

BACKGROUND OF THE INVENTION

Integrated inductors have found widespread use in integrated circuits for RF (radio frequency) power applications. The inductors are typically localized in areas separated from active devices such as transistors to avoid unwanted interference phenomena. Due to the limited possible geometries imposed by the design rules, and to desired Q and inductance values, the inductors will occupy quite much space. This may result in bulky and thus slow circuits.

SUMMARY OF THE INVENTION

A monolithically integrated circuit may include a transistor and a spiral inductor, where the spiral inductor is arranged above the transistor. This arrangement creates an electromagnetic coupling between the inductor and the transistor. The transistor may have a finger type layout to substantially prevent any significant eddy currents caused by the electromagnetic coupling from occurring.

DETAILED DESCRIPTION OF PREFERRED EMBODIMENTS

Figure 1:
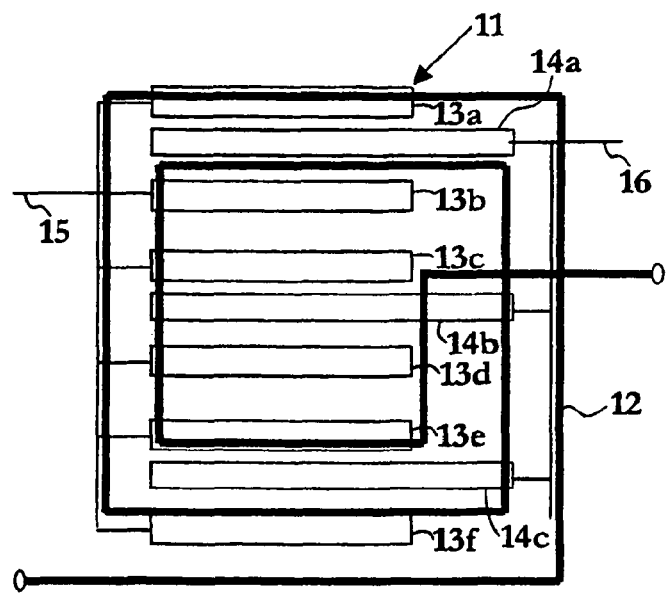
FIG. 1 is a highly enlarged schematic layout of a monolithically integrated circuit according to one embodiment.

A monolithically integrated circuit according to a first embodiment is schematically shown in FIG. 1. The circuit, which is especially aimed for RF applications, comprises a transistor 11 and a spiral inductor 12 arranged on top of the transistor 11 on a semiconductor, preferably silicon, chip substrate. The transistor 11, which in this embodiment is an LDMOS power transistor, has a finger type layout and comprises a number of gate fingers 13a-f arranged in parallel. Similarly, a number of conductive drain fingers 14a-c are arranged in between the gate fingers 13a-f to form an interdigitated structure. A doped elongated drain region is formed in the substrate beneath each of the drain fingers 14a-c. The gate fingers 13a-f are connected to each other via a common gate connection 15 at a first side of the transistor 11, whereas the drain fingers 14a-c are connected to each other via a common drain connection 16 at a second side of the transistor 11 generally opposite to the first side. The source of the LDMOS transistor is connected at the bottom or backside of the chip substrate. Elongated doped source regions are formed in the substrate between the gate fingers 13b and 13c and between the gate fingers 13d and 13e so that, as seen from above, drain fingers/regions and source regions are alternately arranged between each two adjacent gate fingers 13a-f.

The structure may be repeated to form an LDMOS transistor 11 with many more gate and drain fingers/regions and source regions than what is illustrated in FIG. 1.

Further, the LDMOS transistor 11 may, instead of being connected at the backside of the chip substrate, comprise a conductive source finger on top of each of the source regions, where these source fingers are connected together similar to how the gate fingers 13a-f or the drain fingers 14a-c are connected together.

The chip area needed by the circuit including the transistor and the inductor is heavily reduced by means of the present invention. If the lateral dimensions of the transistor and of the inductor are similar the chip area needed is reduced by a factor of two. The area saving depends of course on the particular circuit design but it is very common for power amplifier devices that the transistor and the spiral inductor are of similar size, and also the dominant part of the circuit or the chip.

The monolithically integrated circuit is preferably manufactured in a conventional silicon IC process, e.g. a standard BiCMOS or CMOS process, and does not need the use of processing, which is complex and complicated, or not compatible with conventional IC processing, or do involve an excessive number of steps. The inductor is typically made in some of the metallization layers formed in such a process. Thus, the vertical distance between the transistor 11 and the inductor 12 corresponds typically to the thickness of a passivation layer formed between the transistor and the metallization layers. If the inductor is manufactured in some of the upper metallization layers, which is preferred to avoid direct short circuit and minimize magnetic coupling to the underlying transistor, the vertical separation may be larger due to the thicknesses of the lower metallization layers and their intermediate dielectric layers. The vertical distance between the transistor 11 and the inductor 12 is preferably less than 25 microns, more preferably less than 10 microns, and most preferably less than a few microns.

While the arrangement of FIG. 1 saves valuable chip area, an unwanted electromagnetic coupling between the two devices is difficult to avoid. A circular current similar to the current in the spiral inductor 12 but with opposite direction will most probably be induced in the transistor 11.

The finger type layout of the transistor 11 is important to prevent any significant circular or eddy currents caused by the electromagnetic coupling from flowing, which would have been disastrous for the operation of the circuit. Thus, while an arbitrarily chosen transistor layout would not operate properly, the finger type layout, where narrow layers of opposite conduction type (P, N) are alternately arranged in or on the surface of the chip substrate, prevents any severe eddy currents from flowing.

Figure 2A:
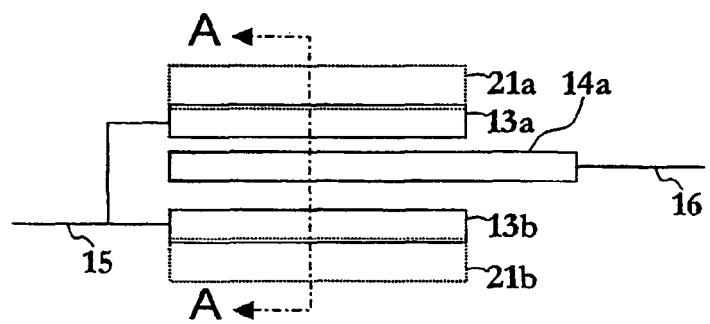
FIG. 2a is a highly enlarged schematic layout of a transistor cell comprised in a transistor of the monolithically integrated circuit of FIG. 1.

A highly enlarged schematic layout of a minimum transistor cell comprised in the transistor 11 of the monolithically integrated circuit of FIG. 1 is illustrated in FIG. 2a. The cell comprises a central drain finger 14a and two gate fingers 13a-b arranged on either side of the central drain finger 14a. Outside each of the gate fingers 13a-b, a respective ion implanted source region 21-b is formed.

Figure 2B:
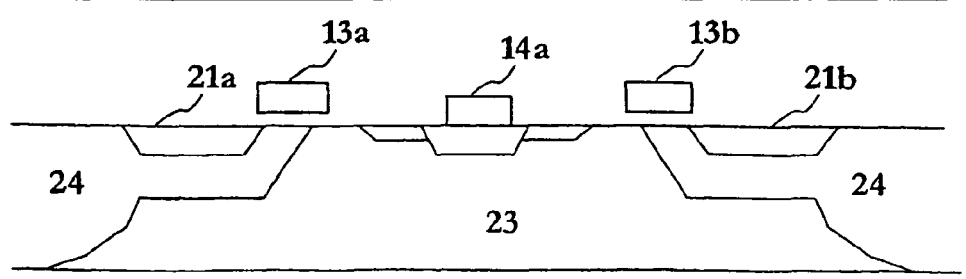
FIG. 2b is a highly enlarged cross sectional view of the transistor cell of FIG. 2a as taken along the line A-A, wherein a passivation layer and part of an inductor comprised in the monolithically integrated circuit of FIG. 1.

The transistor cell of FIG. 2a is in FIG. 2b illustrated in cross sectional view as taken along the line A-A. The chip comprises a substrate 22, in an upper portion of which an N+ doped drain region 23 is formed. The source regions 21-b are separated from the N+ doped drain region 23 by P+ doped sinker regions 24. A dielectric passivation layer 25 formed on top of the structure and part of an inductor 26 formed thereon in some of the metallization layers of the circuit are indicated as well. Contacts from the metallization layers down to the drain finger 14a and the gate fingers 13a-b can be made in a conventional manner by via holes filled with conductive material. Typically, the source regions 21-b are electrically connected to the P+ doped sinker regions 24 by means of metal layer contacts on the substrate surface. The source regions 21a-b are, via these metal layer contacts, typically contacted at the backside of the substrate as indicated above.

It shall be appreciated by one skilled in the art that a large transistor device as commonly used in RF power amplifiers comprises a large number of the minimum transistor cells illustrated in FIGS. 2a-b.

Figure 3:
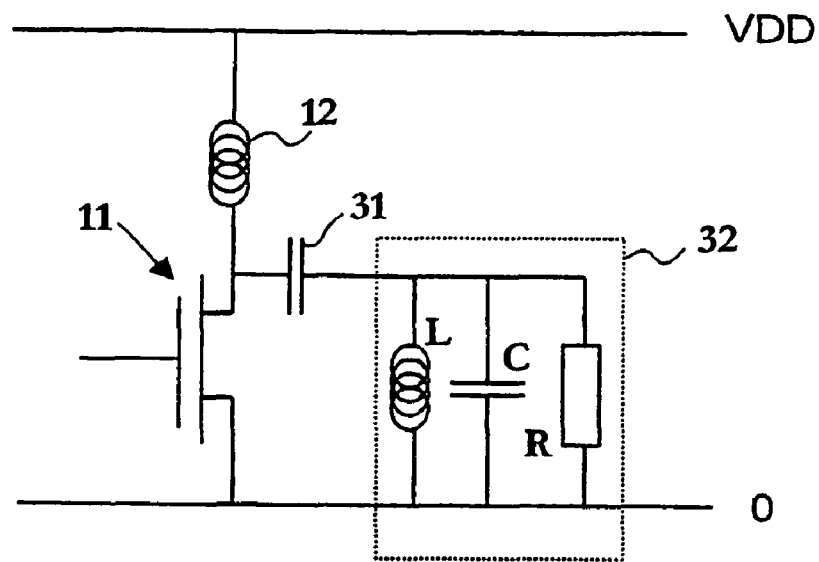
FIG. 3 is a circuit diagram of a circuit according to another embodiment.

A circuit diagram of a monolithically integrated standard power amplifier operating in class A, for which the invention can be used, is illustrated in FIG. 3. Most power amplifiers have similar elements even if they are not operating in class A. The power amplifier comprises a transistor 11, a spiral inductor 12, a DC blocking capacitor, and a tank circuit 32 including an inductor L, a capacitor C, and a resistor R.

The transistor 11 is of finger type as above and is connected to the inductor 12 and the capacitor 31 to block RF and DC currents, respectively. The tank circuit 32 is tuned to the resonant frequency so that the load becomes resistive. The inductor 12 as well as the capacitor 31 have to be large to operate satisfactorily. The inductor 12 is arranged on top of the transistor 11 on the chip according to any other of the preferred embodiments of this description.

Eddy currents in general will show up in any layer of significant conductivity of the transistor. These include in order of importance the common gate and common drain connections, and optionally, if the source is not connected at the backside of the substrate, a common source connection as metal interconnect lines, the substrate, the inversion layer, the gate, the source and drain diffusions, i.e. doped drain and source regions. However, for a finger type power amplifier transistor, the gate and the inversion layers become unimportant since they do not allow any circular currents of significant radius. To reduce the eddy currents in the source and drain diffusions and in the common gate and drain and optionally source connections and render them insignificant, the inductor is only covering the fingers of the transistors as seen from above. Finally, the substrate will always put a final limit the Q value of the inductor, but the other contributions are avoided or reduced by the present invention.

Figure 4:
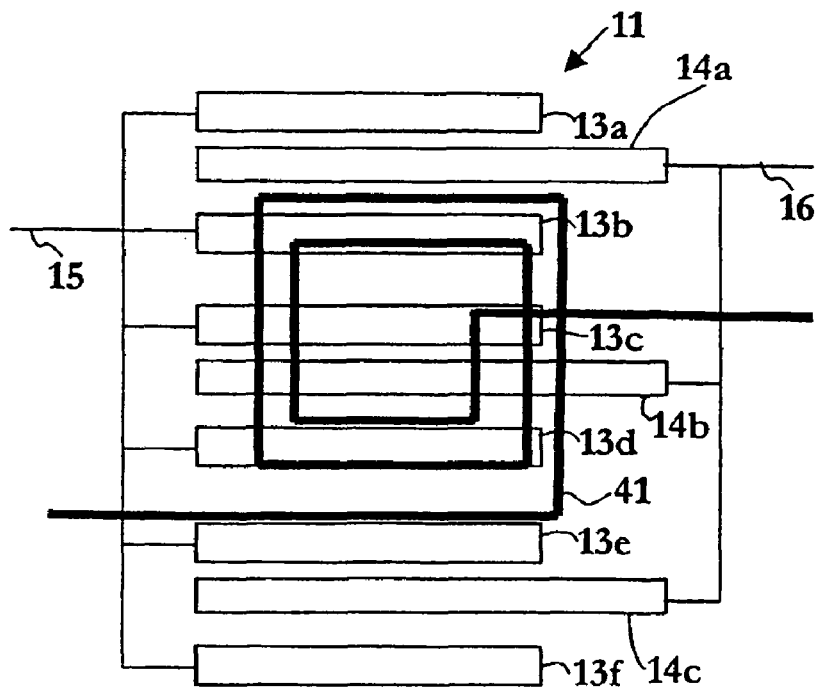
FIGS. 4 and 5 are each a highly enlarged schematic layout of a monolithically integrated circuit according yet additional embodiments.

A highly enlarged schematic layout of a monolithically integrated circuit according another embodiment is illustrated in FIG. 4. The transistor 11 comprises as above gate fingers 13a-f interconnected by a common gate connection 15 and drain fingers 14a-c interconnected by a common drain connection 16. However, this embodiment comprises a somewhat smaller spiral inductor 41. The spiral inductor is arranged so that it covers at least a portion of a plurality 13b-d of the gate fingers 13a-f as seen from above, and leaves the common gate and drain connections 15, 16 uncovered as seen from above. Preferably, a minimum number of the windings parallel with the transistor fingers should be placed directly above a finger since eddy currents along the fingers are more problematic than eddy currents flowing perpendicular to the transistor fingers.

Figure 5:
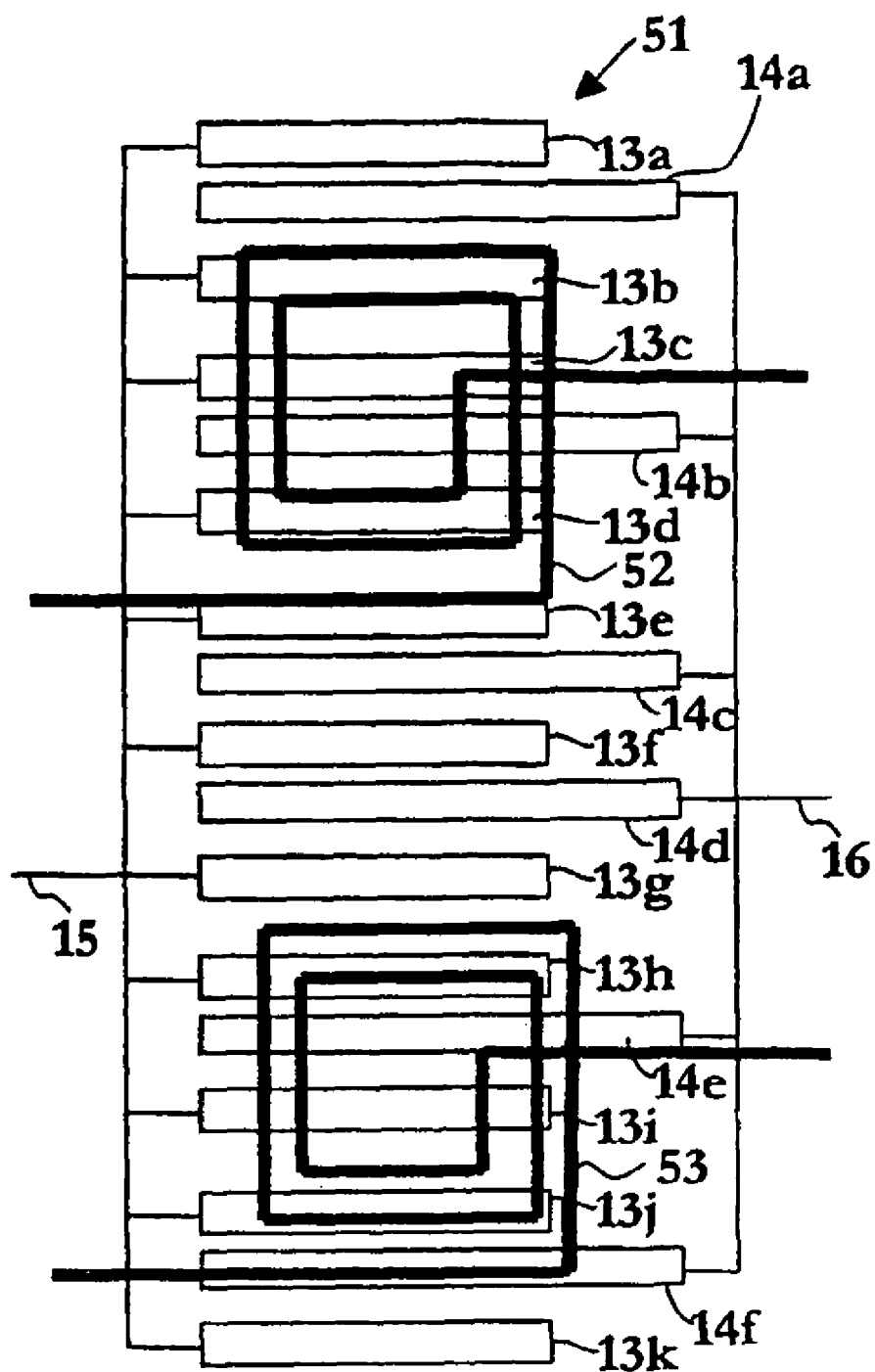

A highly enlarged schematic layout of a monolithically integrated circuit according to yet another embodiment is illustrated in FIG. 5. The integrated circuit comprises multiple spiral inductors 52, 53 arranged on top of a long and narrow transistor 51, wherein eddy currents are still avoided. The illustrated transistor 51 comprises gate fingers 13a-k and interleaved drain fingers 14a-f. The gate fingers 13a-k are connected to the common gate connection 15 and the drain fingers 14a-f are connected to the common drain connection 16. The sources are connected at the backside of the chip.

It shall be appreciated that while the embodiments are primarily intended for silicon based RF power integrated circuits, the embodiments may nevertheless be realized in other material systems such as e.g. GaAs and/or for other kind of applications.

It shall further be appreciated that the transistor 11 is fully exchangeable for a bipolar transistor or a MOS transistor having a finger type layout without departing from the present invention. If the bipolar transistor is a vertical transistor the currents used during operation are mainly vertical, which renders the operation more unaffected by lateral circular and eddy currents. The finger type layout minimizes in any case these lateral currents.

The integrated circuit can be an integrated circuit for radio frequency applications. A lateral dimension of the spiral inductor and a lateral dimension of the transistor can be of the same order of magnitude. The spiral inductor and the transistor may have similar lateral extensions. The spiral inductor can be formed in metallization layers, preferably upper metallization layers, of the integrated circuit, the metallization layers being separated from the transistor by a passivation layer only. A vertical distance between the transistor and the spiral inductor can be less than 25 microns, preferably less than 10 microns, and most preferably less than a few microns. The transistor can be an RF power amplifier transistor and the spiral inductor can be an RF blocking inductor. The transistor can be an LDMOS transistor. The transistor may comprise multiple gate and multiple drain fingers, and the spiral inductor may cover at least a portion of a plurality of multiple gate fingers as seen from above, and leaves common gate and drain connections interconnecting the multiple gate and drain fingers, respectively, uncovered as seen from above. The integrated circuit may comprise multiple spiral inductors arranged on top of said transistor.

By providing a monolithically integrated circuit, particularly an integrated circuit for radio frequency applications, comprising a transistor and a spiral inductor, wherein the spiral inductor is arranged on top of the transistor, valuable chip area is saved. The transistor has a finger type layout to prevent any significant eddy currents caused by electromagnetic coupling between the spiral inductor and the transistor from occurring.

The invention claimed is:
1. A monolithically integrated circuit comprising:
a transistor having a finger type layout; and a spiral inductor arranged above said transistor, wherein an electromagnetic coupling is created between said spiral inductor and said transistor.

2. An integrated circuit according to claim 1, wherein said transistor prevents any significant eddy currents caused by said electromagnetic coupling.

3. An integrated circuit according to claim 1, wherein the integrated circuit is an integrated circuit for radio frequency applications.

4. An integrated circuit according to claim 1, wherein a lateral dimension of said spiral inductor and a lateral dimension of said transistor are of the same order of magnitude.

5. An integrated circuit according to claim 1, wherein said spiral inductor and said transistor have similar lateral extensions.

6. An integrated circuit according to claim 1, wherein said spiral inductor is formed in metallization layers of said integrated circuit, said metallization layers being separated from said transistor by a passivation layer only.

7. An integrated circuit according to claim 6, wherein said spiral inductor is formed in upper metallization layers of said integrated circuit.

8. An integrated circuit according to claim 1, wherein a vertical distance between said transistor and said spiral inductor is less than 25 microns, preferably less than 10 microns, and most preferably less than a few microns.

9. An integrated circuit according to claim 1, wherein said transistor is an RF power amplifier transistor and said spiral inductor is an RF blocking inductor.

10. An integrated circuit according to claim 1, wherein said transistor is an LDMOS transistor.

11. An integrated circuit according to claim 1, wherein said transistor comprises multiple gate and multiple drain fingers, and said spiral inductor covers at least a portion of a plurality of multiple gate fingers as seen from above, and leaves common gate and drain connections interconnecting said multiple gate and drain fingers, respectively, uncovered as seen from above.

12. An integrated circuit according to claim 1, wherein said integrated circuit comprises multiple spiral inductors arranged on top of said transistor.

13. An integrated circuit for radio frequency applications comprising:
a transistor; and
a spiral inductor arranged on above of said transistor, wherein an electromagnetic coupling between said spiral inductor and said transistor is obtained, and said transistor has a finger type layout, wherein a lateral dimension of said spiral inductor and a lateral dimension of said transistor are of the same order of magnitude, and wherein said spiral inductor is formed in metallization layers of said integrated circuit, said metallization layers being separated from said transistor by at least a passivation layer.

14. An integrated circuit according to claim 13, wherein said spiral inductor is formed in upper metallization layers of said integrated circuit.

15. An integrated circuit according to claim 13, wherein said spiral inductor and said transistor have similar lateral extensions.

16. An integrated circuit according to claim 13, wherein a vertical distance between said transistor and said spiral inductor is less than 25 microns, preferably less than 10 microns, and most preferably less than a few microns.

17. An integrated circuit according to claim 13, wherein said transistor is an RF power amplifier transistor and said spiral inductor is an RF blocking inductor.

18. An integrated circuit according to claim 13, wherein said transistor is an LDMOS transistor.

19. An integrated circuit according to claim 13, wherein said transistor comprises multiple gate and multiple drain fingers; and said spiral inductor covers at least a portion of a plurality of multiple gate fingers as seen from above, and leaves common gate and drain connections interconnecting said multiple gate and drain fingers, respectively, uncovered as seen from above.

20. An integrated circuit according to claim 13, wherein said integrated circuit comprises multiple spiral inductors arranged on top of said transistor.

* * * * *